United States Patent [19]

Emoto

[11] Patent Number: 5,063,434
[45] Date of Patent: Nov. 5, 1991

[54] PLASTIC MOLDED TYPE POWER SEMICONDUCTOR DEVICE

[75] Inventor: Takao Emoto, Yokosuka, Japan

[73] Assignee: Kabushiki Kaisha Toshiba, Kawasaki, Japan

[21] Appl. No.: 584,043

[22] Filed: Sep. 18, 1990

[30] Foreign Application Priority Data

Sep. 22, 1989 [JP] Japan .................................. 1-247268

[51] Int. Cl.⁵ .......................................... H01L 23/28
[52] U.S. Cl. ...................................... 357/72; 357/70; 357/80; 357/81
[58] Field of Search ........................ 357/72, 70, 80, 81

[56] References Cited

U.S. PATENT DOCUMENTS 4,617,585 10/1986 Yasui ..................... 357/72

FOREIGN PATENT DOCUMENTS 0004255 1/1981 Japan ..................................... 357/72
0016556 1/1986 Japan ..................................... 357/72
0107152 5/1988 Japan ..................................... 357/22

Primary Examiner—Andrew J. James
Assistant Examiner—T. Davenport
Attorney, Agent, or Firm—Finnegan, Henderson, Farabow, Garrett, and Dunner

[57] ABSTRACT

According to this invention, a semiconductor chip incorporating a power control element is mounted on a heat dissipation member by a conductive solder, and lead members electrically connected to terminals extending from the semiconductor chip are arranged to have a surface level almost equal to that of the heat dissipation member. A main body structure including the semiconductor chip and the members is sealed by a sealing plastic body. A plastic table integrated with the sealing plastic body projects and is formed at a position corresponding to a lower side of outer leads which extends from the heat dissipation and lead members and is extracted from the sealing plastic body, and the outer leads are bent upward at a position corresponding to a position of the plastic table. The sealing plastic body is mounted on an external mounting member having a heat dissipation function.

8 Claims, 2 Drawing Sheets

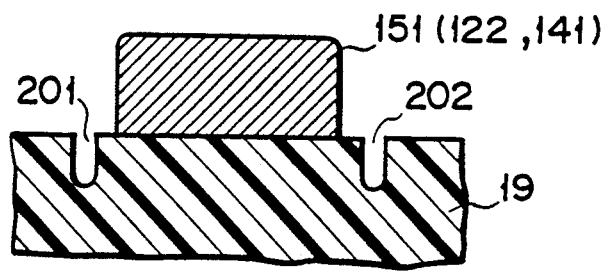
F I G. 4
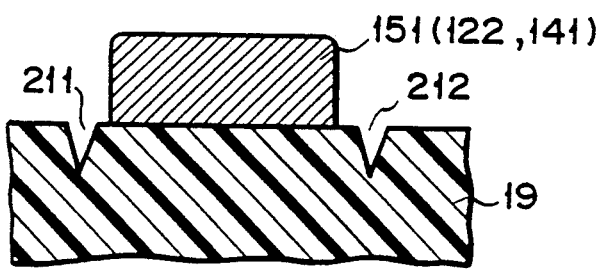
F I G. 5

PLASTIC MOLDED TYPE POWER SEMICONDUCTOR DEVICE

BACKGROUND OF THE INVENTION

1. Field of the Invention

The present invention relates to a plastic molded type power semiconductor device, especially used for controlling a high-voltage power, in which a semiconductor chip is mounted and set on a heat dissipation member of lead frame, the heat dissipation member is covered with an external plastic material so as to also cover its lower surface, and the semiconductor device is used while being mounted on a mounting plate having a heat dissipation function.

2. Description of the Related Art

Since a power control semiconductor device generates heat during an operation of the device, an important condition in its arrangement is that heat dissipation characteristics of the device are set to be sufficient. In a plastic molded type power semiconductor device, a heat dissipation section incorporated in the semiconductor device which is tightly mounted on an external mounting member constituting a heat dissipation unit having, e.g., a cooling fin or the like, is used. In this case, the external mounting member must be made of a material having good heat conductivity. For example, as the material, a metal material such as aluminum generally having electric conductivity is used.

FIG. 6 is a conventional plastic molded type power semiconductor device. The semiconductor device comprises a heat dissipation member 41 made of a metal material such as copper, and a power control semiconductor chip 43 is mounted on the heat dissipation member 41 by a Pb-Sn solder 42. In this case, the heat dissipation member 41 also serves as a heat dissipation plate for conducting heat generated from the semiconductor chip 43. In addition, a lead member 44 made of the same material as that of the heat dissipation member 41 is set at a position spaced apart from the heat dissipation member 41. The lead member 44 is connected to an extending terminal of the semiconductor chip 43 on the heat dissipation member 41 by a bonding wire 45. Thus, a main body of the semiconductor device is constituted.

The main body constituted by the heat dissipation member 41, the semiconductor chip 43, the lead member 44, and the bonding wire 45 is sealed by a transfer-molded plastic body 46. In this case, an insulated type structure in which the heat dissipation member 41 is covered with the plastic body 46 so as to also cover its lower surface portion is used, and the heat dissipation member 41 is mounted by screws or the like on an external mounting member 47 made of a metal material through the plastic layer on the lower surface of the heat dissipation member 41.

In the semiconductor device arranged as described above, even when the device is directly mounted on the external mounting member 47 to dissipate heat, since the external mounting member 47 is electrically insulated from the heat dissipation member 41, an insulating member such as a mica plate need not be used. Therefore, the plastic molded type semiconductor device can be practically used with good workability, and this structure has been used as a major structure of a power semiconductor device. However, in accordance with a decrease in size of a semiconductor device of this type, various problems are posed. For example, when a semiconductor device sealed by a sealing plastic is mounted on the external mounting member 47, an interval a between an outer lead 441 portion extending from the plastic body 46 of the lead member 44 to the outside and the mounting member 47 has a minimum size determined by the rated dielectric breakdown voltage. In order to decrease the size of the semiconductor device, the thickness of the insulator on the lower surface portion of the heat dissipation member must be decreased as much as possible However, when the thickness is decreased, the interval a is naturally decreased, and a satisfactory dielectric breakdown voltage cannot be obtained For this reason, as shown in FIG. 6, the height of the heat dissipation member 41 from the external mounting member 47 is different from that of the lead member 44 to position the lead member at a level higher than the major surface of the heat dissipation member 41.

When the heat dissipation member 41 and the lead member 44 are arranged to have a step difference therebetween, the structure of the member portion is complicated, and a connecting operation of the bonding wire 45 is cumbersome. In addition, since the semiconductor chip 43 on the heat dissipation member 1 is connected to the lead member 44 by the bonding wire 45, a ratio of a size (thickness) above a major surface of the heat dissipation member 41 to a size (thickness) below the major surface of the heat dissipation member 41 is usually "(5 to 10) : 1". Therefore, a thickness b of the semiconductor device is limited, and a decrease in size of the semiconductor device is limited.

SUMMARY OF THE INVENTION

It is an object of the present invention to provide a plastic molded type power semiconductor device in which a size of the whole semiconductor device can be sufficiently decreased so that a sufficient dielectric breakdown voltage can be obtained at an outer lead portion in a positional relationship between the device and an external mounting member.

It is another object of the present invention to provide a structure of a plastic molded type semiconductor device in which an interval between an outer lead and an external mounting member can be set to be large without increasing the height of the semiconductor device.

It is still another object of the present invention to set a dielectric breakdown voltage at an outer lead portion higher than a voltage corresponding to an interval between the outer lead and a mounting member, to easily improve reliability of a plastic molded type power semiconductor device of this type, and to easily perform a mounting operation for practical assembly According to the present invention, in a plastic molded type semiconductor device in which a heat dissipation member having a semiconductor chip and a main body structure connected to a lead members by a bonding wire are sealed with a plastic body, the surface level of the heat dissipation member and the surface level of the lead member are almost equal to each other, a plastic table located between outer leads of the lead members and the dissipation member and the external mounting member is formed in the plastic body while it contacts the lower surface of the outer leads extending from the plastic body to the outside is bent in a direction to separate the outer leads from the external mounting member at an outlet portion from the plastic body.

In a plastic molded type semiconductor device with the above arrangement, the table made of a plastic is interposed between the outer leads extending from a sealing plastic body to the outside and the external mounting member to increase an insulation distance between the outer leads and the external mounting member. In this state, since the outer leads are bent in a direction to separate the outer leads from the external mounting member, the insulation distance between the outer leads and the external mounting member can be easily further increased to properly improve reliability of a power semiconductor device for controlling a power having a high voltage. In addition, the distance between the heat dissipation member having the semiconductor chip and the external mounting member can be easily decreased, and the plastic molded type semiconductor device can be easily designed to have a small size, especially a small height.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 and 5 are sectional views for explaining two plastic tables integrally formed with plastic molded bodies of the another embodiments, respectively.

DETAILED DESCRIPTION OF THE PREFERRED EMBODIMENTS

Figure 1:
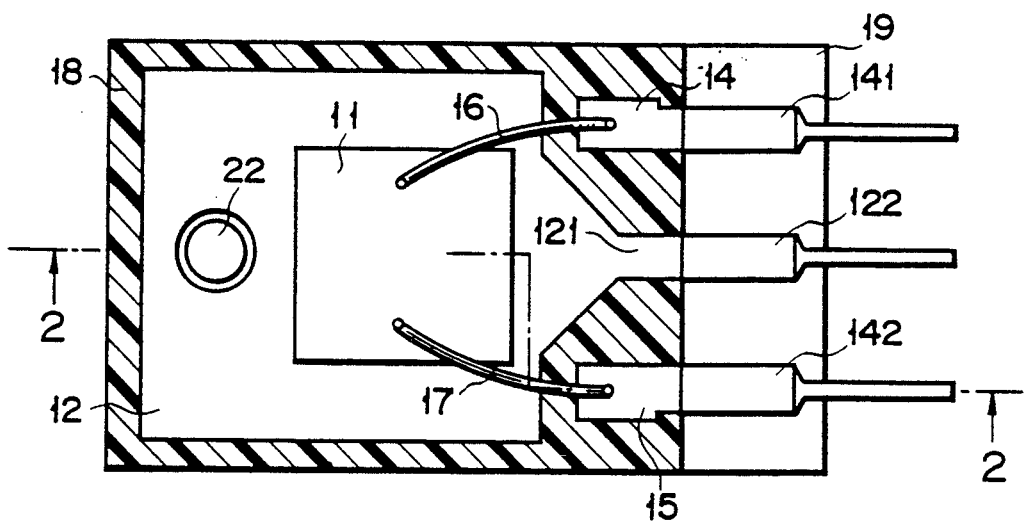
FIG. 1 is a plan view showing a semiconductor chip and a member structure for explaining a plastic molded type power semiconductor device according to the first embodiment of the present invention.
Figure 2:
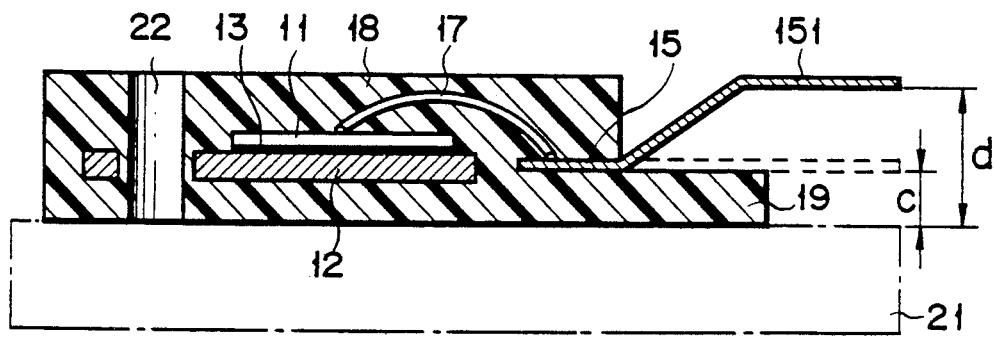
FIG. 2 is a sectional view showing the semiconductor device taken along a line 2—2 in FIG. 1.

A power semiconductor device comprises a semiconductor chip 11 constituting a power transistor having, e.g., a collector electrode, an emitter electrode, and a base electrode. As shown in FIGS. 1 and 2, the semiconductor chip 11 is provided on a heat dissipation member 12 made of, e.g., copper having good heat and electrical conductivity by a Pb-Sn solder 13. In this case, the lower surface of the semiconductor chip 11 serves as the collector electrode of the power transistor, and the heat dissipation member 12 also serves as a collector lead. A lead member 121 is integrally formed with the heat dissipation member 12 in one direction parallel to the surface, and the lead member 121 extends as the collector electrode.

With the above heat dissipation member 12, lead members 14 and 15 made of the same material as that of the heat dissipation member 12 are arranged at positions electrically insulated from the dissipation member 12. The lead members 14 and 15 are located at both sides of the lead member 121 formed on the heat dissipation member 12 and are parallel to the lead member 121. The surface level of the heat dissipation member 12 and the surface level of the lead members 14 and 15 are almost equal to each other. Terminals corresponding to the emitter and the base of the semiconductor chip 11 constituting the power transistor are connected to the lead members 14 and 15 by bonding wires 16 and 17 made of an Au or Al thin wire, respectively.

In this case, although not shown, when the semiconductor chip 11 must be protected from contamination, silicone encapsulation or the like is applied to the chip 11.

As described above, the semiconductor chip 11 is mounted on the heat dissipation member 12, and the main body structure in which the semiconductor chip 11 is connected to the lead members 14 and 15 by the bonding wires 16 and 17 is molded by a sealing plastic body 18 made of an outer-layer plastic material such as epoxy resin. In this case; outer leads 122, 141, and 151 respectively extending from the lead members 121, 14, and 15 are parallelly extracted from one side surface of the sealing plastic body 18.

A plastic table 19 is integrally connected with the sealing plastic body 18 in correspondence with a lower surface portion which supports the outer leads 122, 141, and 151 so as to project from one side surface of the sealing plastic body from which the outer leads 122, 141, and 151 extend.

The outer leads 122, 141, and 151 extending from the side surface of the sealing plastic body 18 are bent upward at an outlet portion of the sealing plastic body 18 so as to separate the outer leads 122, 141, and 151 from the plastic table 19.

Figures 3A, 3B:
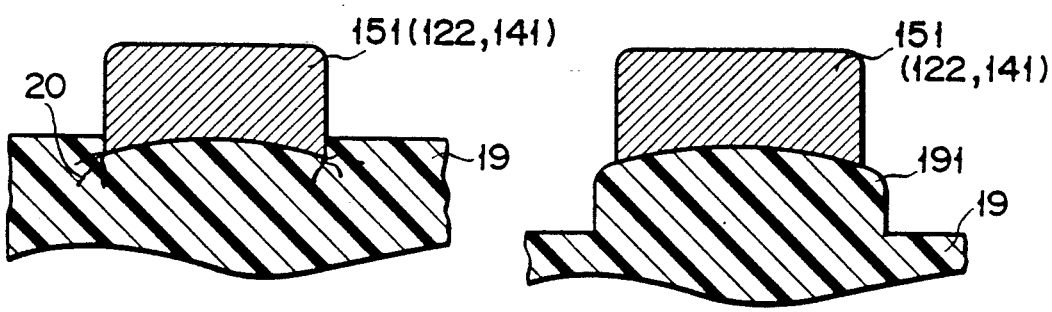
FIGS. 3A and 3B are sectional views for explaining a plastic table integrally formed with a plastic molded body of the semiconductor device in FIG. 2.

That is, in the state wherein the sealing plastic body 18 is integrally connected with the plastic table 19, as indicated by a broken line in FIG. 2, the outer leads 122, 141, and 151 are integrally connected on the plastic table, as shown in FIG. 3A. Thereafter, the outer leads 122, 141, and 151 are bent to have a shape shown in FIG. 2. In this case, the outer leads 122, 141, and 151 are bent at the outlet portion from the sealing plastic body 18 so as to separate the outer leads from the plastic table 19, and the bending position must be set inside the edge of the plastic table 19.

When the outer leads 122, 141, and 151 are to be removed from the plastic plate 19, as shown in FIG. 3A, cracks 20 may be formed in the plastic table 19 to extend from bonded portions between corners of each lead and the plastic table 19.

In order to prevent formation of the cracks 20, as shown in FIG. 3B, convex support tables 191 which are higher then other portions are on the plastic table 19 at portions contacting the outer leads 122, 141, and 151, respectively. The plastic table 19 is such that each of the outer leads 122, 141, and 151 is bonded to the corresponding support table 191. In the above arrangement, when the outer lead is peeled from the support table 191, even if cracks are formed, the cracks do not reach the inside of the plastic table 19. According to the arrangement shown in FIG. 3B, defective products produced at a ratio of 0.5 to 5% due to cracks in the arrangement in FIG. 3A can be eliminated.

A plastic molded type semiconductor device with the above arrangement is mounted and fixed on an external mounting member 21 made of a metal having good heat conductivity by inserting a screw into a mounting hole 22 through the sealing plastic body 18 and the dissipation member 12. In this case, although not shown, a heat dissipation fin or the like is provided to the external mounting member 21 as needed to obtain a heat dissipation mechanism of the semiconductor device.

In a plastic molded type semiconductor device with the above arrangement, plastic molding is performed such that the plastic table 19 extending from the side surface of the sealing plastic body 18 is provided below the outer leads 122, 141, and 151, and the outer leads 122, 141, and 151 are bent at their proximal ends in a direction to separate the outer leads from the external mounting member 21. Therefore, a sufficiently large interval d between the outer leads 122, 141, and 151 and the external mounting member 21 is obtained compared with an interval c between the outer leads and the external mounting member when the outer leads 122, 141, and 151 extend straight from the sealing plastic body 18. In addition, a surface insulation distance including a surface from which the outer leads 122, 141, and 151 are peeled is set to set a sufficiently high dielectric breakdown voltage at the outer leads 122, 141, and 151.

In this case, since the surface of the heat dissipation member 12 is set at a level almost equal to the surface level of the lead members 14 and 15, the thickness of the wiring structure including the bonding wires 16 and 17 or the like ca be made sufficiently small. The thickness above the heat dissipation member 12 of the sealing plastic body 18 can be made small. Therefore, the plastic molded type semiconductor device can be easily formed to be thin, and a compact plastic molded type semiconductor device can be formed, thus keeping a sufficiently high dielectric breakdown voltage.

Figure 6:
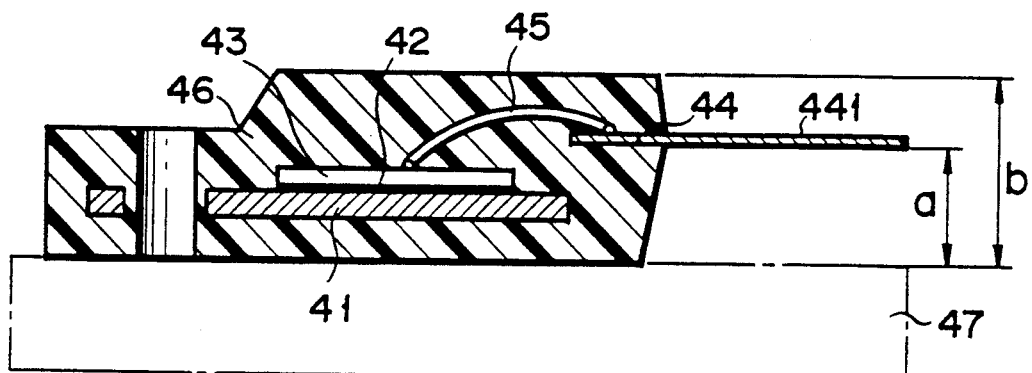
FIG. 6 is a sectional view showing an arrangement for explaining a conventional plastic molded type semiconductor device.

Although the semiconductor device has a structure in which a heat dissipation surface of the lower surface portion of the heat dissipation member 12 is electrically insulated by the sealing plastic body 18, the thickness of a plastic layer of the lower surface of the heat dissipation member 12 can be made small, and the thickness of the plastic layer on the surface of the heat dissipation member 12 can be equal to the thickness of the lower surface portion (in the structure shown in FIG. 6, a ratio of (5 to 10) : 1), thereby largely improving heat dissipation characteristics.

For example, although a power transistor had Pc=20 W and the thickness of heat dissipation plastic layer being set to be 400 μm in the structure shown in FIG. 6, the thickness of a plastic layer could be set to be 250 μm and a power Pc=30 W could be obtained according to the structure described in the embodiment.

To prevent formation of cracks, a support table is in the structure shown in FIG. 3B. However, formation of cracks can also be prevented by trenches 201 and 202 as shown in FIG. 4 or trenches 211 and 212 in the plastic table on the sides of the outer lead 151 as shown in FIG. 5.

In this embodiment, although a power transistor for controlling a high voltage is specifically exemplified, this structure of the present invention can be directly applied to a plastic molded type semiconductor device constituting a rectifying device having poor heat dissipation characteristics, an integrated circuit element, or the like.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plastic molded type power semiconductor device comprising:
   a heat dissipation member of a metal having heat conductivity:
   a semiconductor chip, mounted on the heat dissipation member so as to conduct heat to the heat dissipation member, the semiconductor chip including a heat generating semiconductor element, and terminals;
   lead members, each electrically connected to one of the terminals;
   a sealing plastic body including a side surface, a lower surface, and a main body disposed around the heat dissipation member, the semiconductor chip, and the lead members, the main body including a plastic sealing material;
   outer leads, each connected to a respective one of the lead members, each outer lead including a first outer lead portion, and a second outer lead portion extending from the main body; and
   a plastic table integrated with the sealing plastic body, extending from the side surface of the sealing plastic body main body and contacting the outer leads, wherein the second outer lead portions are vertically removed from the plastic table and bent in a direction away from the lower surface of the sealing plastic body.

2. A device according to claim 1, wherein said heat dissipation member is electrically connected to an electrode on the lower surface of said semiconductor chip, and an integral outer lead is integrally connected to said heat dissipation member with a lead member, wherein said plastic table is on a lower surface of said integral outer lead, and said integral outer lead is bent at a position corresponding to said plastic table in a direction to separate said integral outer lead from said support table.

3. A device according to claim 1, wherein said outer leads are bent at a position inward an end of said plastic table.

4. A device according to claim 1, wherein each outer lead includes a lower surface, and the device further includes a support table constituted by a convex portion of the plastic material and integrated with said plastic table while said support table contacts the lower surfaces of said outer leads.

5. A device according to claim 4, wherein said support table is formed and processed together with said sealing plastic body and said plastic table while said support table contacts said outer leads, and then said outer leads are peeled from said support table.

6. A device according to claim 1, wherein said heat dissipation member is electrically connected to an electrode on the lower surface of said semiconductor chip, and an integral outer lead is integrally connected to said heat dissipation member with a lead member.

7. A device according to claim 6, wherein said plastic table on a lower surface of said integral outer lead, and said integral outer lead is bent at a position corresponding to said plastic table in a direction to separate said integral outer lead from said support table.

8. A device according to claim 1 or 7, wherein trenches are formed in said plastic table along two sides of said outer leads respectively.

* * * * *

UNITED STATES PATENT AND TRADEMARK OFFICE
CERTIFICATE OF CORRECTION

PATENT NO. : 5,063,434
DATED : November 05, 1991
INVENTOR(S) : Takao Emoto

It is certified that error appears in the above-identified patent and that said Letters Patent is hereby corrected as shown below:

Claim 1, column 6, line 9, after "conductivity" change ":" to --;--.

Claim 7, column 6, line 61, after "table" insert --is--.

Signed and Sealed this

Tenth Day of August, 1993

Attest:

MICHAEL K. KIRK

Attesting Officer

Acting Commissioner of Patents and Trademarks